United States Patent
Wego et al.

(10) Patent No.: US 7,155,191 B2
(45) Date of Patent: Dec. 26, 2006

(54) METHOD AND ARRANGEMENT FOR REDUCING PHASE JUMPS WHEN SWITCHING BETWEEN SYNCHRONIZATION SOURCES

(75) Inventors: Arild Wego, Lier (NO); Pal Longva Hellum, Blommenholm (NO)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 163 days.

(21) Appl. No.: 10/521,388

(22) PCT Filed: Aug. 30, 2002

(86) PCT No.: PCT/NO02/00304

§ 371 (c)(1),
(2), (4) Date: Jan. 14, 2005

(87) PCT Pub. No.: WO2004/021636

PCT Pub. Date: Mar. 11, 2004

(65) Prior Publication Data

US 2005/0245223 A1    Nov. 3, 2005

(51) Int. Cl.
H04B 1/06 (2006.01)
H04B 7/00 (2006.01)
H04B 1/40 (2006.01)
(52) U.S. Cl. .................... 455/265; 455/76; 327/147
(58) Field of Classification Search .............. 455/265, 455/76, 260, 180.3; 331/14, 25; 327/147, 327/156, 291; 370/516, 506; 375/214, 215
See application file for complete search history.

(56) References Cited

U.S. PATENT DOCUMENTS

| | | | |
|---|---|---|---|
| 6,489,852 B1* | 12/2002 | Beaulieu | 331/25 |
| 6,653,874 B1* | 11/2003 | Ishikawa | 327/147 |
| 6,744,787 B1* | 6/2004 | Schatz et al. | 370/516 |
| 6,968,027 B1* | 11/2005 | Fukuhara | 375/376 |
| 6,999,480 B1* | 2/2006 | Subrahmanyan et al. | 370/516 |
| 7,088,155 B1* | 8/2006 | Takahashi | 327/147 |
| 2003/0085742 A1* | 5/2003 | Jain | 327/156 |
| 2004/0145400 A1* | 7/2004 | Mariggis | 327/291 |

FOREIGN PATENT DOCUMENTS

| | | |
|---|---|---|
| JP | 2000 201068 A | 7/2000 |
| WO | WO 98 25367 A | 6/1998 |

OTHER PUBLICATIONS

European Patent Office, International Search for PCT/NO02/00304, dated Apr. 10, 2003.

* cited by examiner

Primary Examiner—Aung Moe
(74) Attorney, Agent, or Firm—Roger S. Burleigh

(57) ABSTRACT

A method and an arrangment for reducing phase jumps in a frame synchronization signal when switching between synchronization signal when switching between synchronization reference sources are disclosed. A new reference signal to which each of the two reference sources (signals) are phase locked, and has frequency n times the respective reference signal, is generated. A selection signal selects the new reference signal to be used, and the selected one is then divided back to its original frequency creating an input signal to a phase-locked loop generating the resulting frame synchronization signal. In this way, the maximum phase jumps are reduced from one period of the original reference signals to one period of the new reference signal. The invention is particularly applicable for reducing phase jumps on a master frame synchronization signal in a PDH system.

11 Claims, 4 Drawing Sheets

METHOD AND ARRANGEMENT FOR REDUCING PHASE JUMPS WHEN SWITCHING BETWEEN SYNCHRONIZATION SOURCES

FIELD OF THE INVENTION

The present invention is related to synchronisation in communication networks, in particular to reduction of phase jumps in a frame synchronisation signal when switching between synchronisation reference sources.

BACKGROUND OF THE INVENTION

The lower layer of communication networks like the connectivity layer in a core network of a cellular environment could be seen as a layer of distributed resources for managing data flows. Some of the main nodes comprised in such networks are switches routing and directing data from input to output lines. Reliable internal synchronisation in these switches is crucial i.a. for keeping bit slips through the switches as low as possible.

The switches are normally equipped with internal Time Division Multiplex buses leading frames consisting of time slots of data from the receiving to the transmitting side of the switch in a predefined way. For a regular transmission of the frames, they are synchronised with a master timer initiating transmission of each frame.

The H.110 standard specifies that inside a node, e.g. a switch, there will be two potential providers of the master timing, primary master and secondary master. The purpose of having two master timers is that if the primary master fails, the secondary master will take over the timing in the node. Reasons for this may be line failure in some of the input lines, signal of poor quality, power outage, etc.

The clock sources for the primary and secondary master are reference signals, netref#1, and netref#2. Any of the serial input ports in a node can be the source for netref#1 and netref#2. These clocks are synchronised to the specific timing in the network.

However, the problem area is not specially related to the H.110 solution, but acts as an example. To illustrate the problem this document issues, an additional example system is taken into consideration, namely the Plesichronous Digital Hierarchy (PDH). PDH is a transmission protocol normally applied for data transmission at data rate magnitudes of 64 kbit/s to 139,264 Mbit/s.

FIG. 1 shows a simplified block diagram and timing diagram of the synchronisation mechanism in a PDH system. One of two (or more) references that are usually extracted from serial data links is used as the timing reference for a master frame synchronisation signal. The references (REF1 and REF2) and the frame synchronisation signal (FRAME_SYNC) are usually 8 kHz signals (125 us period) indicating one TDM frame.

REF1 and REF2 may have an arbitrary phase relation. A PLL is mainly used for jitter attenuation and to smooth out phase variations at switch-over from one reference to another. An external select signal (SEL) selects whether REF1 or REF2 shall be chosen as timing reference. At switch-over from one reference to another (i.e. when the chosen reference disappears or if the quality of the reference is poor), the phase difference between the references will lead to a phase jump on the input of the PLL. This will gradually lead to a phase change on the frame synchronisation signal. The phase change may be up to one period of the reference signals (worst case). The two worst-case phase jump conditions are illustrated in FIG. 2 and FIG. 3.

A FIFO is normally placed ahead of the TDM bus for reducing the effect of data rate variations and small phase irregularities. However, such FIFOs are not dimensioned to absorb large phase jumps, as the use of deep FIFOs lead to longer timing delays and more logic. Thus, the phase jump in the frame synchronisation signal as described above, may result in an overflow in the FIFO, which in turn would lead to bit slips and bit errors, and resynchronisation and retransmission of data at switch-over from one timing reference to another may be necessary.

WO 98/25367 and WO 98/25368 disclose variants of a method of generating a system clock signal periodically locked to a selected one of a plurality of phase-locked loops, each of which emitting a clock signal in phase-locked relationship with an external reference signal. A digital error signal is transferred from the selected phase-locked loop to a central numerically controlled oscillator, and the system clock is locked to the output signal from the central numerically controlled oscillator.

U.S. Pat. No. 5,909,149 discloses a multi-band locked loop employing multiple switchable voltage controlled oscillators. A single PLL is provided having a different voltage controlled oscillator for each desired frequency band. The transfer function of the phase detector in the phase-locked loop is switched responsive to the particular band selected for maintaining the loop natural frequency at the same point regardless of other changes in the loop transfer function, such as changes in the frequency slope of the voltage controlled oscillators and changes in the division ratio of the loop divider circuit.

One of the drawbacks of WO 98/25367 and WO 98/25368 is that much logic is necessary since several phase detectors and numerically controlled oscillators are required. This contributes to a very complicated solution. In addition, a digital error signal must be integrated over a period of time.

U.S. Pat. No. 5,909,149 is truly related to problems with switching between two frequency references, but it only concerns switching problems that occur when switching from one frequency band to another, and not phase jumps between two references with the same frequency. Thus, the publication does not solve this problem since it is not attenuating phase jumps when switching between the frequency references.

SUMMARY OF THE INVENTION

It is an object of the present invention to provide a method and an arrangement that eliminates the drawbacks described above. The features defined in the claims enclosed characterize this method and arrangement. In particular, the invention discloses a method and an arrangement in a telecommunication or data communication network for reducing phase jumps in a frame synchronisation signal when switching from a first original reference signal to a second reference signal. The method comprises the steps of generating a first and a second master reference signal phase locked to the first and the second original reference signal, respectively, each with a frequency n times the frequency of the corresponding original reference signal, selecting one of the master reference signals by a selection signal, dividing the frequency of the selected master reference signal back to the frequency of its corresponding reference signal, inputting the frequency divided signal into a Phase-Locked Loop circuit for generating the frame synchronisation signal. The arrangement implements this method.

BRIEF DESCRIPTION OF THE DRAWINGS

In order to make the invention more readily understandable, the discussion that follows will refer to the accompanying drawings.

DETAILED DESCRIPTION

The present invention describes a method of reducing phase jumps in a frame synchronisation signal when switching between synchronisation reference sources.

The present invention is based on the realization of the fact that when generating a master frame synchronisation signal, it is necessary to lock to the frequency of the reference, but the phase relation to the reference has no importance.

To reduce the phase jump at switch-over from one reference to another, the present invention introduces "clocks" (MREF1 and MREF2) that are phase locked to the reference signals with a frequency that is n times the reference signals (n is an integer number). These clocks may be generated by counters clocked by a high frequency clock (CLK), and reset by the reference signal, as shown in FIG. 4.

After the mux, the selected "clock" (MREF) is divided back to the original frequency again. In this way the maximum phase jumps are reduced from one period of the reference signal to one period of the MREF signal, as illustrated in FIG. 4. The frequency of the MREF "clocks" should be as high as possible to minimize the phase jumps at switch-over, but it must not be so high that a variable number of MREF "clock" periods between two REF pulses appears. This will occur when the frequency of MREF is so high that the period of MREF is smaller than the delta period of the maximum tolerable frequency deviation of the REF signal (REF(nominal period)—REF(min period) or REF (max period)—REF(nominal period). Consequently, the MREF period must always be longer than this maximum period variation.

Figure 1:
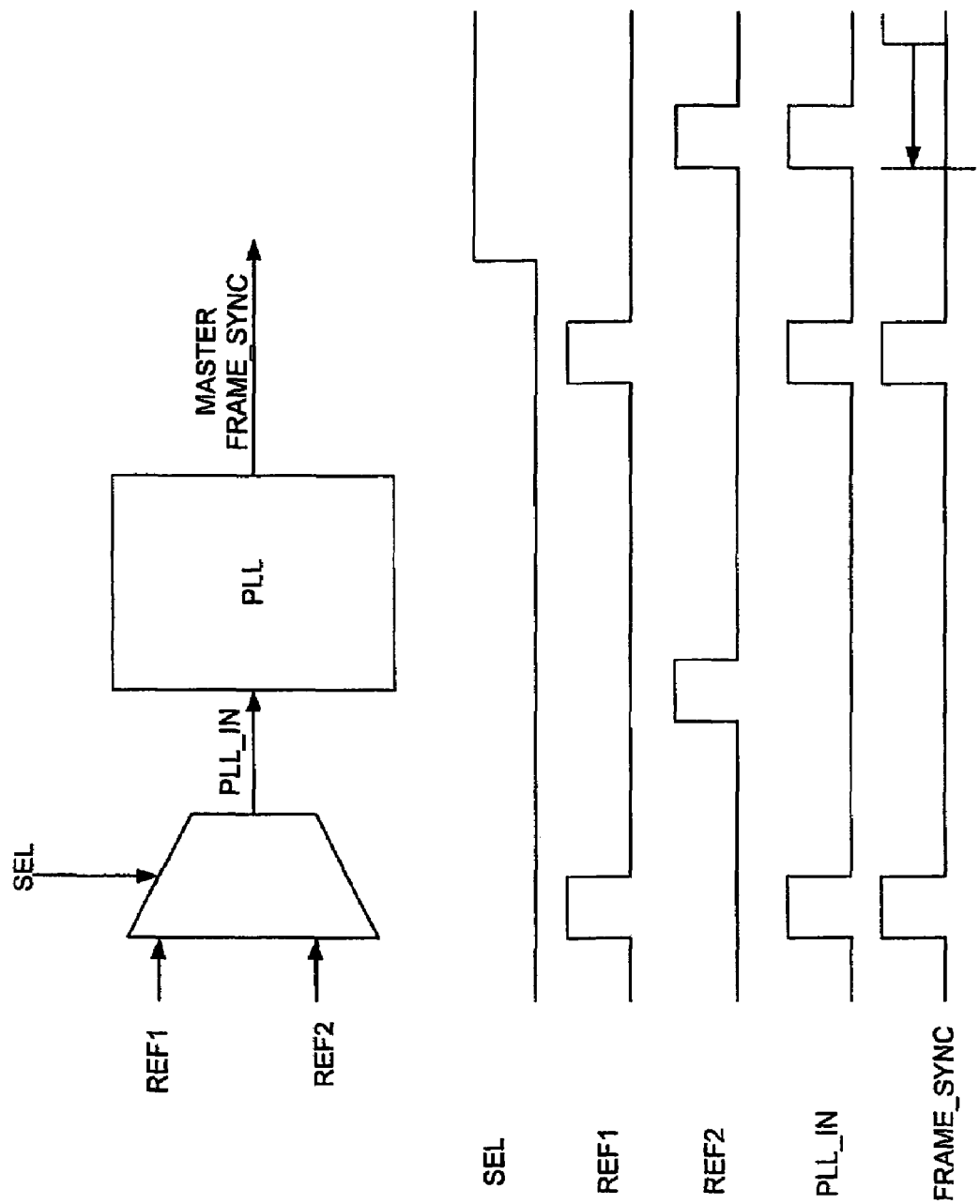
FIG. 1 shows a block and timing diagram illustrating the basic concept of the synchronisation mechanism in a PDH system.
Figure 2:
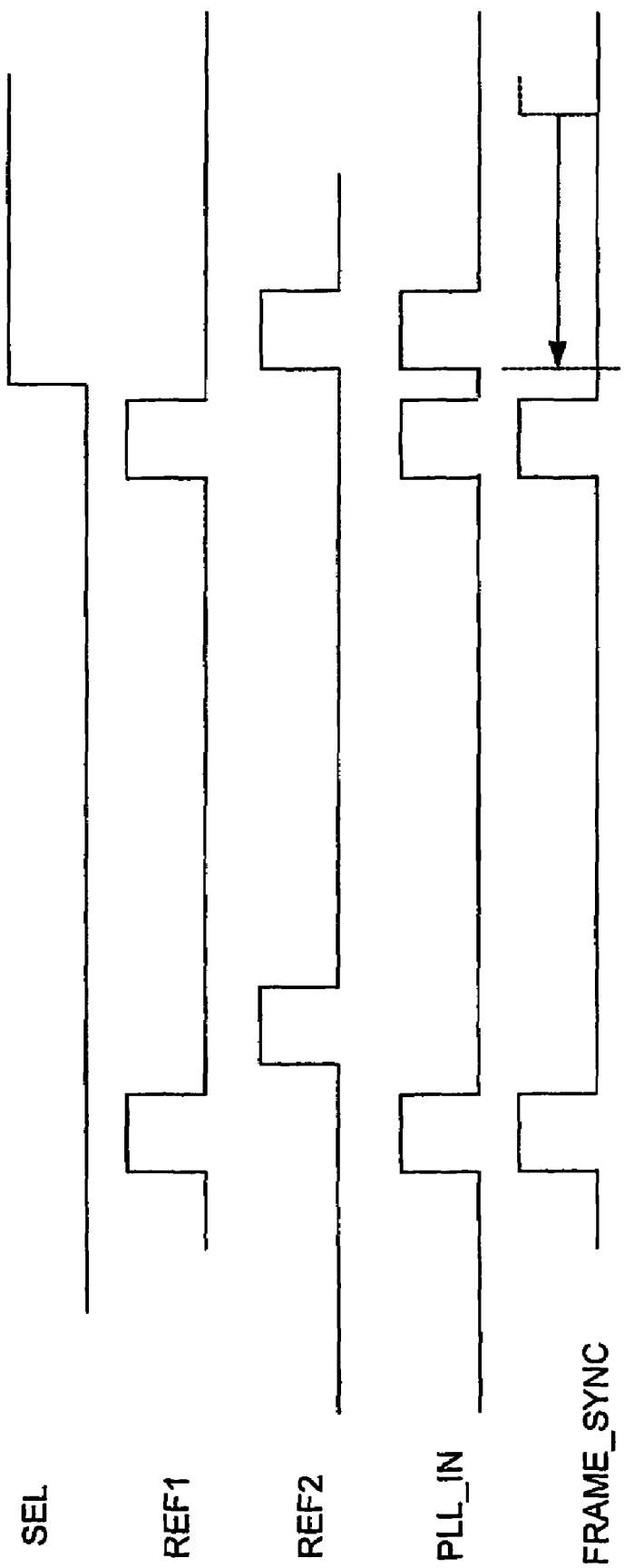
FIG. 2 shows timing diagrams illustrating one of the worst-case phase jumps in frame synchronisation signal in the system of FIG. 1.
Figure 3:
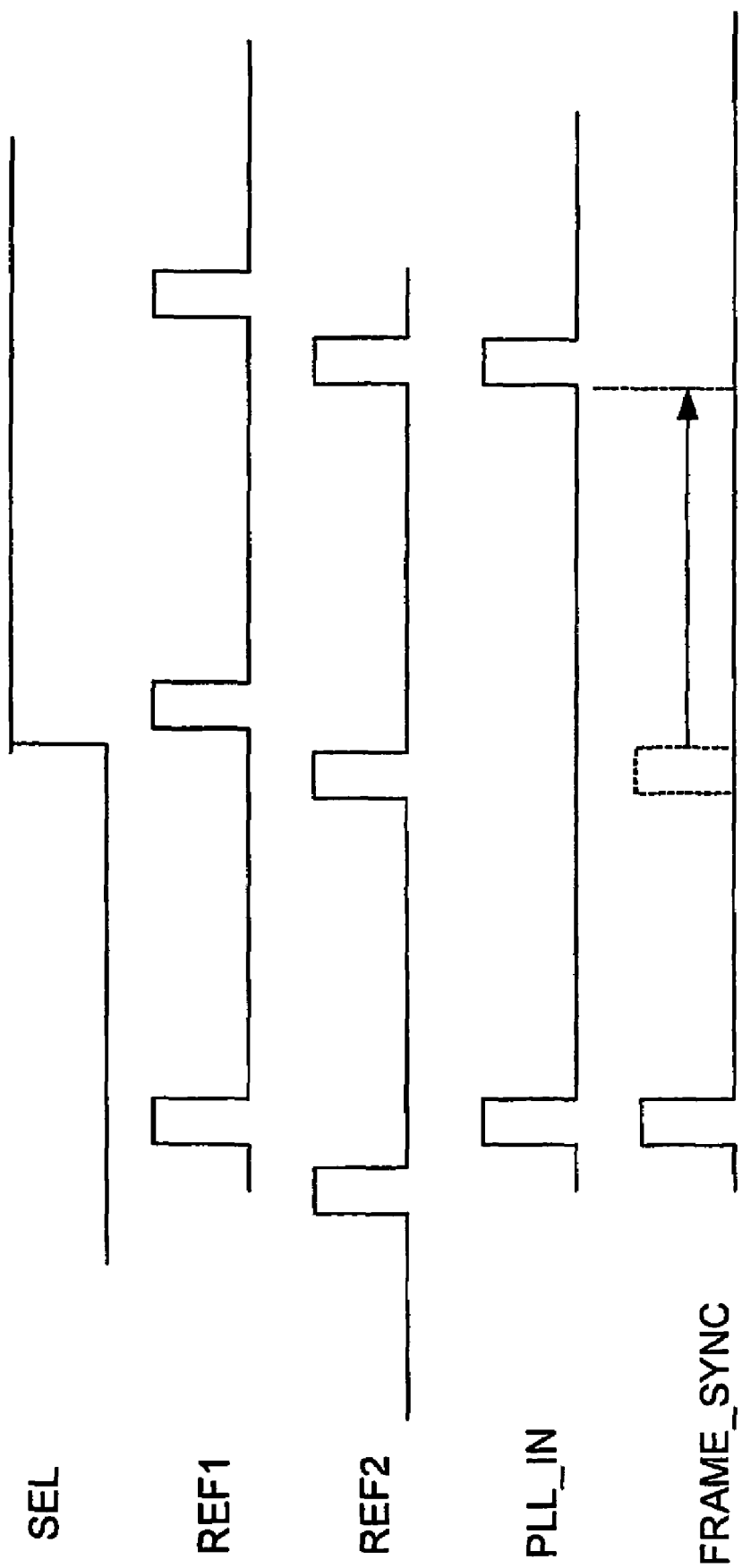
FIG. 3 shows timing diagrams illustrating the other worst-case phase jump in frame synchronisation signal in the system of FIG. 1.
Figure 4:
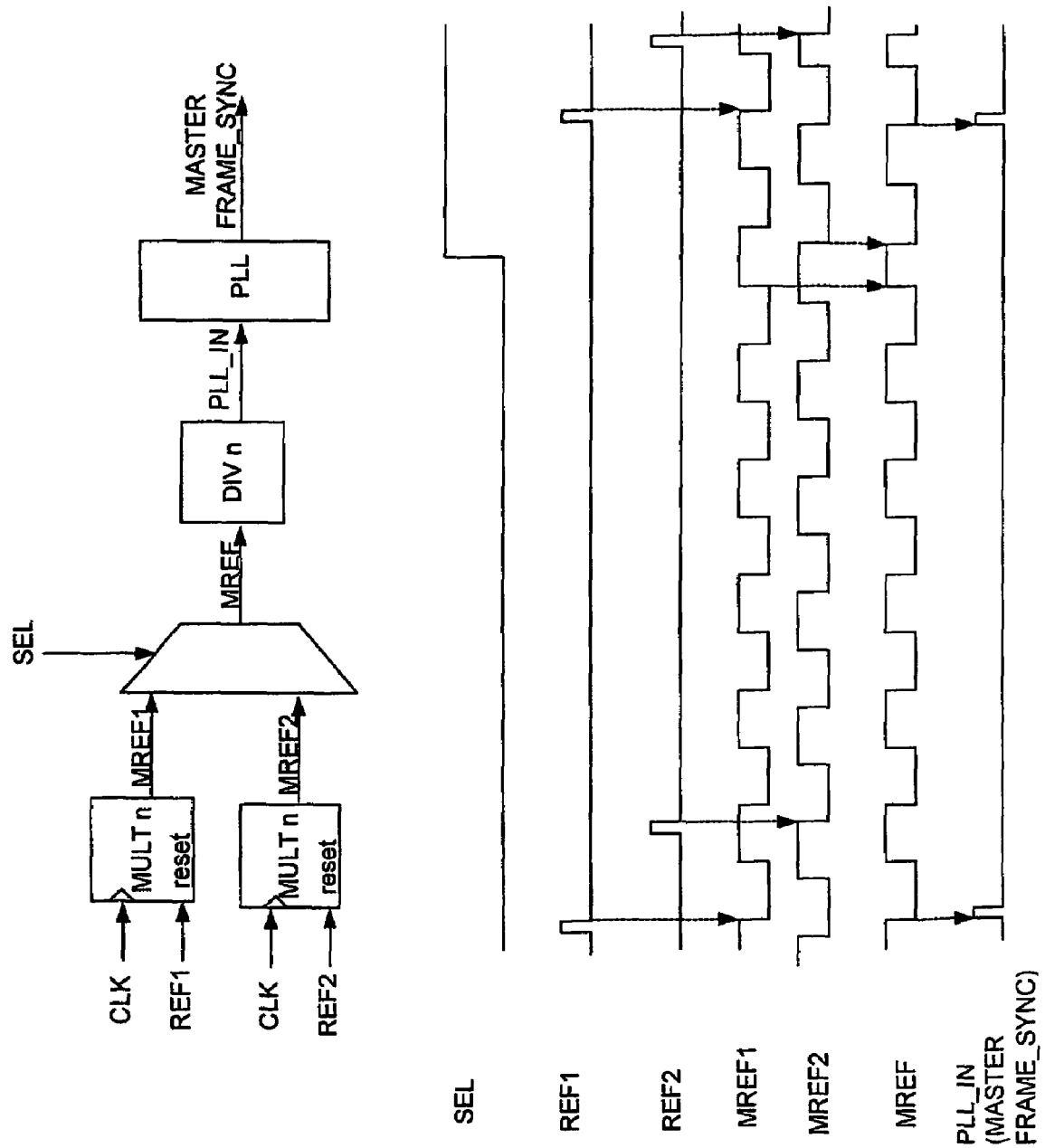
FIG. 4 shows a block and timing diagram illustrating an is example of the synchronisation mechanism in a PDH system improved according to the present invention.

An example embodiment of the present invention, together with timing diagrams illustrating a scenario where the reference signal is shifted, is shown in FIG. 4. This scenario illustrates the effect of the present invention.

The two reference signals available, REF1 and REF2, generate MREF1 and MREF2 by phase-locking clock signals having a frequency of n times the frequency of the respective reference signals with the reference signals themselves. MULT n indicates that the MREF1 and MREF2 frequencies are, respectively, the REF1 and REF2 frequencies multiplied with n where n is a power of two integers (2, 4, 8, 16 etc.). MREF1 and MREF2 are multiplexed with the selection signal (SEL), so that MREF1 is selected when SEL is low, and MREF 2 when SEL is high. The selected MREF signal is then divided by n (preferably by a counter) leading to PLL_IN, which is the input of the PLL circuit finally outputting the resulting master frame synchronisation signal. DIV n indicates that the PLL_IN frequency is the MREF frequency divided by n where n is the same integer as in MULT n.

In the case illustrated in FIG. 4, PLL_IN goes high right after REF1. This is just for showing that the phase of PLL_IN does not change even if SEL changes from REF1 to REF2. The PLL_IN goes high because the DIV element has counted n periods. MREF is reset at next REF2, but because the periods of MREF1 and MREF2 are shorter than the maximum phase variation between two REF pulses, a variable number of MREF "clock" periods between two REF pulses will not occur. It should be noted that it is no longer any correlation between the phase of REF1/REF2 and PLL_IN. The original PLL has now become a frequency-locked loop (FLL) is that suppresses phase jumps bigger than one MREF period.

MULT n indicates that the MREF1 and MREF2 frequencies are, respectively, the REF1 and REF2 frequencies multiplied with n where n is a power of two integers (2, 4, 8, 16 etc.). DIV n indicates that the PLL_IN frequency is the MREF frequency divided by n where n is the same integer as in MULT n.

It should be noted that the logical levels and the specific logical devices chosen in the timing and block diagram of FIG. 4 could be chosen differently. The purpose of the timing and block diagram is to illustrate an embodiment and a scenario of events that may occur when utilising the present invention, and is not limiting the scope of it as defined in the independent claims enclosed.

The main advantage of the present invention is that max phase jumps at switch from one reference to another can be reduced from one period of the reference signal to the delta period of the maximum tolerable frequency deviation of the REF signal (REF(nominal period)—REF(min period) or REF(max period)—REF(nominal period).

Further, bit faults can be avoided at switch-over from one reference to another without implementing large FIFOs, giving reduced bit error rate. Avoiding large FIFOs also reduce timing delays and the amount of logic.

The present invention provides a non-complicated solution, and less resynchronisation and retransmission of data will be needed.

ABBREVIATIONS

FIFO First In First Out buffer
FLL Frequency Locked Loop
PDH Plesichronous Digital Hierarchy
PLL Phase-Locked Loop
PDH Plesichronous Digital Hierarchy

REFERENCES

WO 98/25367 and WO 98/25368; A method and a circuit for generating a system/central clock signal
U.S. Pat. No. 5,909,149; Multiband phase-locked loop using a switched voltage controlled oscillator

The invention claimed is:

1. A method in a telecommunication or data communication network of reducing phase jumps in a frame synchronisation signal when switching from a first reference signal to a second reference signal, said method comprising the steps of:

generating a first and a second master reference signal phase locked to the first and the second reference signals, respectively, each master reference signal having a frequency n times the frequency of the corresponding reference signal;

selecting one of the master reference signals by a selection signal;

dividing the frequency of the selected master reference signal back to the frequency of its corresponding reference signal; and, inputting the frequency divided signal into a Phase-Locked Loop circuit for generating said frame synchronization signal.

2. The method recited in claim 1, wherein in the selection step, the first master reference signal is selected when the selection signal is a low, and the second master signal is selected when the selection signal is high.

3. The method recited in claim 1, wherein the dividing step is carried out by counting the number of periods of the selected master reference signal and outputting a pulse like in the corresponding reference signal for each $n^{th}$ period of the selected master reference signal.

4. The method recited in claim 1, wherein the periods of the master reference signal are longer than the delta period of maximum tolerable frequency deviation of the corresponding reference signal.

5. The method recited in claim 1, wherein the frame synchronization signal is a master frame synchronization signal in a PDH system.

6. A system in a node of a telecommunication or data communication network of reducing phase jumps in a frame synchronization signal when switching from a first reference signal to a second reference signal, said system comprising:

one or more circuits for generating first and second reference signals;

one or more circuits for generating a first and a second master reference signal phase locked to the first and the second reference signals, respectively, each with a frequency n times the frequency of the corresponding reference signal, a multiplexer with the first and the second master reference signal as input in addition to a selection signal for selecting one of the master reference signals as the output of the multiplexer;

a divider dividing the frequency of the output of the multiplexer back to the frequency of the corresponding reference signal; and, a Phase-Locked Loop circuit for generating the frame synchronization signal having the divider output signal as input.

7. The system recited in claim 6, wherein the multiplexer selects the first master reference signal when the selection signal is low, and the second master reference signal when the selection signal is high.

8. The system recited in claim 6, wherein the divider is a counter counting the number of periods of the output signal of the multiplexer outputting a pulse like in the corresponding reference signal for each $n^{th}$ period of the output signal of the multiplexer.

9. The system recited in claim 6, wherein the periods of the master reference signals are longer than the delta period of maximum tolerable frequency deviation of the corresponding reference signal.

10. The system recited in claim 6, wherein the node is a switch.

11. The system recited in claim 6, wherein the frame synchronization signal is a master frame synchronization signal in a PDH system.

* * * * *